United States Patent [19]
Brown et al.

[11] Patent Number: 5,589,682

[45] Date of Patent: Dec. 31, 1996

[54] PHOTOCURRENT DETECTOR CIRCUIT WITH HIGH SENSITIVITY, FAST RESPONSE TIME, AND LARGE DYNAMIC RANGE

[75] Inventors: Dale M. Brown, Schenectady; Gerald J. Michon, Waterford, both of N.Y.

[73] Assignee: General Electric Company, Schenectady, N.Y.

[21] Appl. No.: 474,238

[22] Filed: Jun. 7, 1995

[51] Int. Cl.$^6$ .............................. H01J 40/14; H03F 17/00; G01J 5/28
[52] U.S. Cl. ...................... 250/214 A; 250/554; 330/110
[58] Field of Search .......................... 250/214 A, 214 R, 250/214 AG, 554; 330/59, 110, 308; 359/189

[56] References Cited

U.S. PATENT DOCUMENTS

| | | | |
|---|---|---|---|
| 3,440,557 | 4/1969 | Sundeen, Jr. ............................ | 330/110 |
| 3,999,060 | 12/1976 | Skagerlund ........................ | 250/214 R |
| 5,030,925 | 7/1991 | Taylor ..................................... | 330/110 |
| 5,202,553 | 4/1993 | Geller .................................. | 250/214 A |

*Primary Examiner*—Edward P. Westin
*Assistant Examiner*—Kevin Pyo
*Attorney, Agent, or Firm*—Ann M. Agosti; Marvin Snyder

[57] ABSTRACT

A photocurrent detector circuit includes a photodiode coupled to an input terminal of a first operational amplifier. A first resistor has a first end coupled to the photodiode and a second end coupled to an output terminal of the first operational amplifier. A first diode has a first end coupled to the photodiode. A second resistor has a first end coupled to a second end of the first diode. A low gain bias network is coupled between a second end of the second resistor and the output terminal of the first operational amplifier. A second diode has a first end coupled to the photodiode. A clamp bias network is coupled between a second end of the second diode and the output terminal of the first operational amplifier. Preferably, the photodiode and the first and second diodes include silicon carbide. The detector may further include second and third operational amplifiers coupled to the output terminal of the first operational amplifier. A MOSFET differential pair can be coupled between the photodiode and the first operational amplifier to form a differential amplifier.

11 Claims, 3 Drawing Sheets

PHOTOCURRENT DETECTOR CIRCUIT WITH HIGH SENSITIVITY, FAST RESPONSE TIME, AND LARGE DYNAMIC RANGE

BACKGROUND OF THE INVENTION

Silicon carbide (SiC) photodiodes such as disclosed in commonly assigned Brown et al., U.S. Pat. No. 5,394,005, have high optical responsivity in the ultra-violet region. It would be desirable to use SiC photodiodes in detector circuits, however, the photon flux impinging on a gas turbine optical flame detector port is very small (i.e., on the order of $1\times10^9$ per second per square centimeter), especially during start up procedures, when the primary flame is at a low intensity level.

SUMMARY OF THE INVENTION

In order to amplify the photon flux signal, a large feedback resistor can be used in an operational amplifier circuit. After a turbine has been started and has reached high operating power levels, however, the photon flux can be 500 to 1000 times larger than it is during start up. Large signal size in combination with the high gain requirement for detecting start up signals can result in early amplifier saturation and slow recovery times determined by the values of a capacitance of the photodiode and resistance of a feedback resistor. Because both of these parameters are relatively large, the recovery time can be many seconds. To reduce the risk of internal fires and explosions occurring when fuel is injected into a hot engine without controlled ignition, the response time should be on the order of tens of milliseconds.

In order to track characteristics of a flame such as flame intensity, temperature, vibration, or dynamics, a large dynamic range (ratio of maximum signal detectable without amplifier saturation to minimum signal detectable) of a multiple of 500 to 5000 is also desired. This range cannot be provided by a simple operational amplifier circuit with gain high enough to detect the minimum signal levels at start up because the amplifier would saturate at low operating signals.

It would be desirable to have a photocurrent detector circuit capable of meeting the three seemingly incompatible goals of sensitivity, fast response time, and large dynamic range.

In accordance with one embodiment of the present invention, for example, a photocurrent detector circuit may comprise a photodetector and a first operational amplifier. The photodetector is coupled to an input terminal of the first operational amplifier. A first resistor has a first end coupled to the photodetector and a second end coupled to an output terminal of the first operational amplifier. A first diode has a first end coupled to the photodetector. A second resistor has a first end coupled to a second end of the first diode. A low gain bias network is coupled between a second end of the second resistor and the output terminal of the first operational amplifier. A second diode has a first end coupled to the photodetector. A clamp bias network is coupled between a second end of the second diode and the output terminal of the operational amplifier.

Preferably, the photodetector comprises a silicon carbide photodiode, and the first and second diodes comprise silicon carbide. The detector may further include second and third operational amplifiers coupled to the output terminal of the first operational amplifier and comprising non-inverting and inverting operational amplifiers, respectively. A MOSFET differential pair can be coupled between the photodetector and the first operational amplifier to form a differential amplifier.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Although the invention is applicable to both np and pn type photodiodes and diodes, for purposes of simplicity of illustration the following description will consider a circuit having np type photodiodes and diodes. If pn type photodiodes and diodes are used, the circuit would remain substantially the same except that the output polarities would be reversed.

Figure 1:
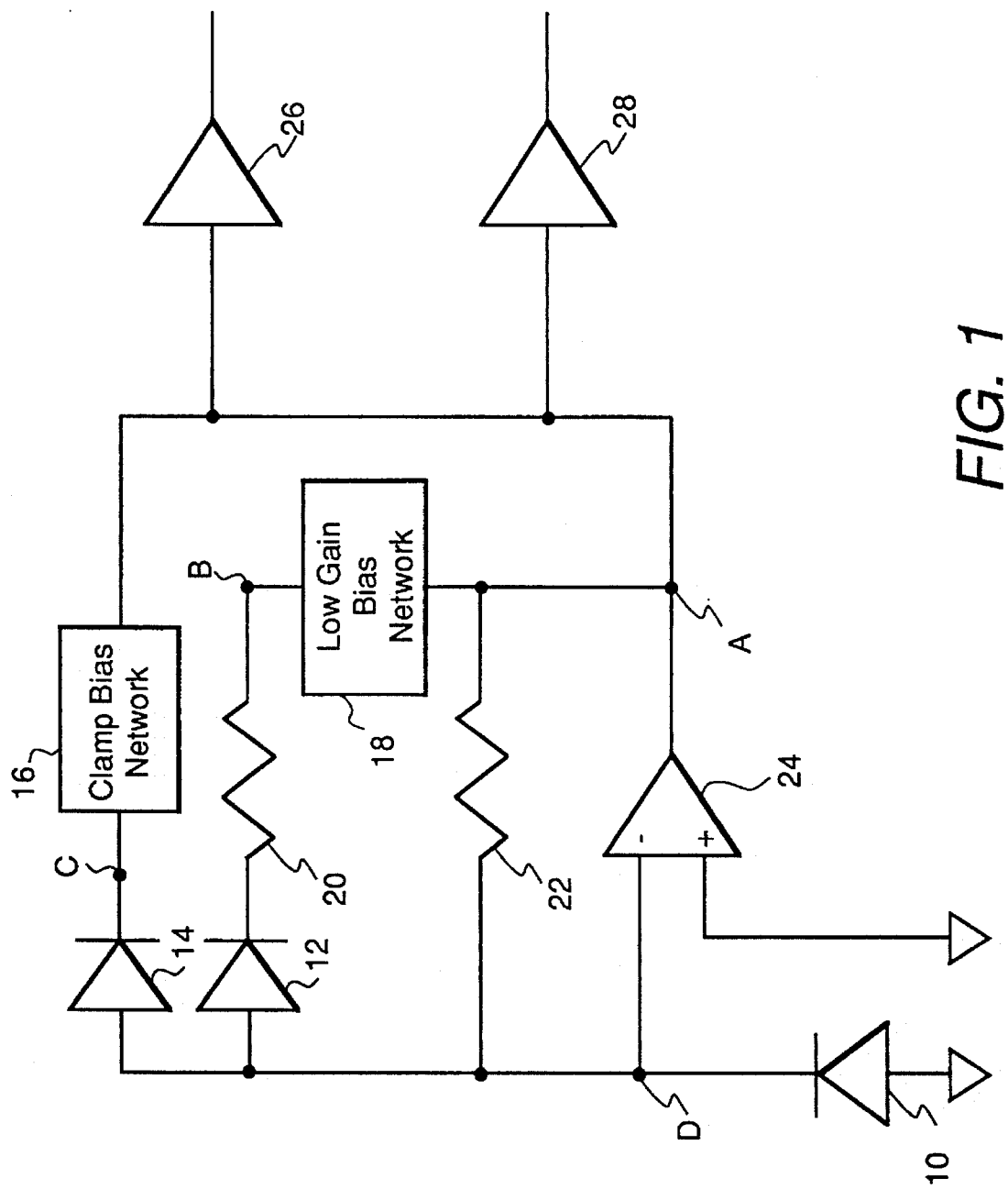
FIG. 1 is a circuit diagram of the present invention.

FIG. 1 is a circuit diagram of the present invention. In a photocurrent detector a transimpedance amplifier approach can be used to convert an ultra-violet signal into a voltage signal. The circuit of FIG. 1 includes a photodetector which is shown for illustrative purposes as photodiode 10, an operational amplifier 24, a low gain diode 12, a low gain feedback resistor 20, a low gain bias network 18, a clamp diode 14, a clamp bias network 16, a high gain feedback resistor 22, a non-inverting operational amplifier 26 and an inverting operational amplifier 28.

Photodiode 10 senses an optical intensity signal and transmits the signal to operational amplifier 24 which has a gain controlled by diodes 12 and 14, feedback resistors 20 and 22, clamp bias network 16, and low gain bias network 18.

Preferably photodiode 10 comprises silicon carbide (SIC) because SiC material is capable of strong performance and structural integrity and very low leakage current with high internal impedance under high temperature and high pressure conditions. SiC is also a beneficial material for diodes 12 and 14, especially if the diodes will be situated in or near a harsh environment. The circuit may alternatively comprise silicon, gallium arsenide (GaAs), gallium phosphide (GaP), or gallium nitride (GaN) diodes and photodiodes if the environmental and system application can provide for sufficient cooling to ensure that the components would not exhibit excessive dark current leakage.

Photodiode 10 is coupled to an input terminal (shown in FIG. 1 as a negative input terminal) of operational amplifier 24, as well as to diodes 12 and 14 and to one end of high gain feedback resistor 22. Clamp diode 14 is coupled to clamp bias network 16 and low gain diode 12 is coupled through low gain feedback resistor 20 to low gain bias network 18. The output terminal of operational amplifier 24, the other end of feedback resistor 22, and output ends of the clamp and low gain bias networks are each coupled to operational amplifiers 26 and 28.

When low level signals are sensed by the photodiode, such as, for example, during start up, operational amplifier 24 uses high gain feedback resistor 22 through node A because the clamp bias network and the low gain bias network do not permit the diodes to conduct current.

At about one-half full scale signal (at one-half the maximum signal detectable without amplifier saturation), the low gain bias network permits low gain diode 12 to conduct by causing the voltage at node B to reach the turn-on voltage of the low gain diode (in one example about −2.2 volts), and therefore the high gain feedback resistor is shunted with the low gain feedback resistor. The value of the low gain feedback resistor is preferably on the order of about 100 times less than the value of the high gain resistor. In one embodiment, the high gain resistor is $2\times10^9$ ohms, and the low gain resistor is $2\times10^7$ ohms. For example, if the maximum input signal is about 0.25 μamps and the minimum detectable signal is about 0.05 nanoamps in the high gain region, then the dynamic range is about 5000.

When the output signal of the photodiode exceeds full scale signal, clamp bias network 16 permits clamp diode 14 to conduct by causing the voltage at node C to reach the turn-on voltage of the clamp diode, thereby clamping the output signal to a value just below saturation. This clamp function is used to maintain fast response in those potential circumstances wherein the flame intensity exceeds the dynamic range capabilities of the circuit. Such circumstances can occur during a flame "flashback" which produces a very high intensity and is followed by a "blow out" or flame extinction. It is very important to detect flame extinctions quickly so that the fuel can be turned off rapidly because continued injection of fuel without a flame can result in an explosion leading to turbine destruction.

The circuit is a high impedance circuit, so low capacitance, low leakage clamping and gain switching diodes are useful to maintain quick recovery times. In one embodiment, diodes 12 and 14 comprise very small SiC diodes having areas of about ten microns by ten microns.

Figure 2:
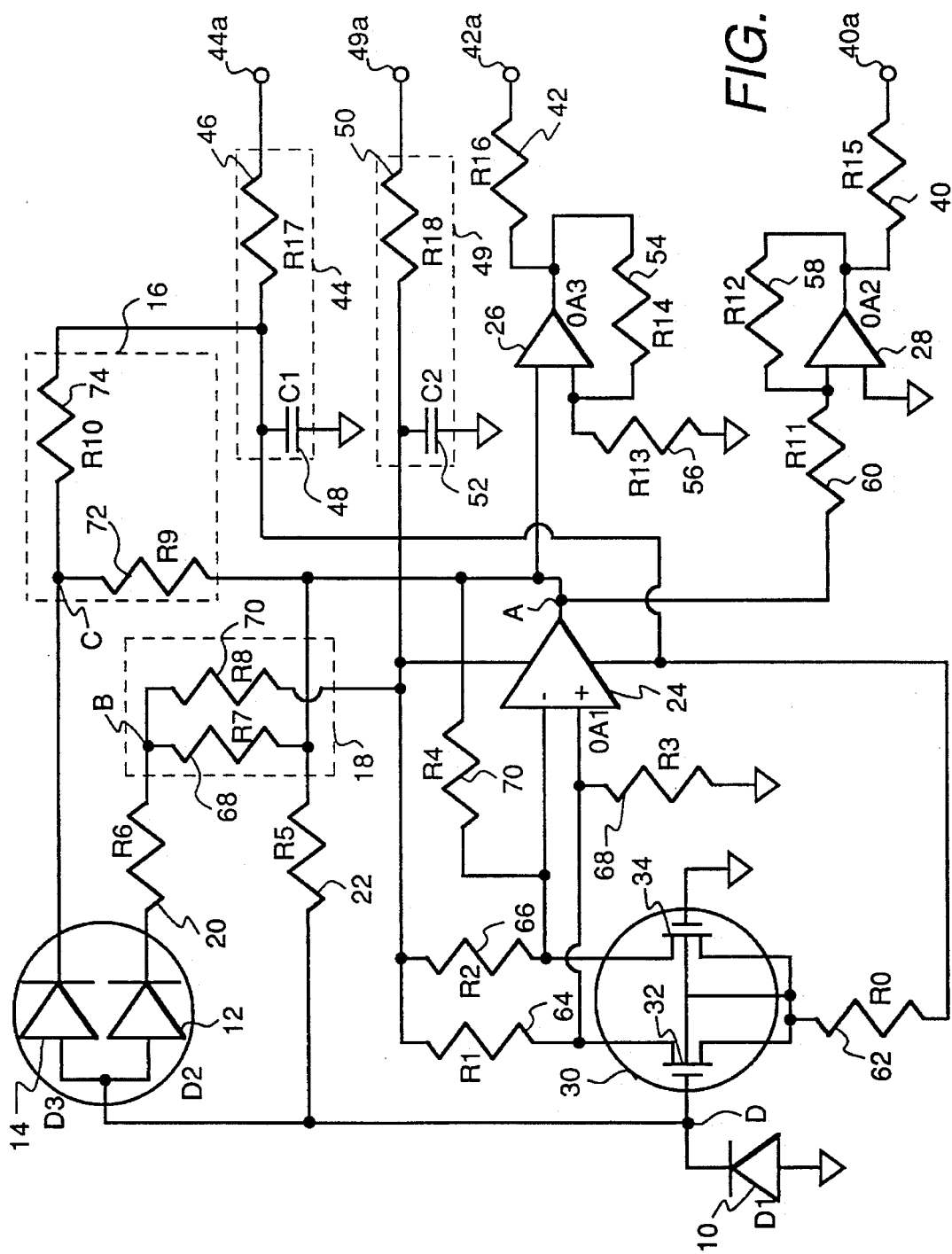
FIG. 2 is a circuit diagram showing further details of one embodiment of the present invention.

FIG. 2 is a circuit diagram showing further details of one embodiment of the present invention. A MOSFET (metal oxide semiconductor field effect transistor) differential pair 30 without gate protection and an operational amplifier 24 (OA1) act as a differential amplifier circuit. In another embodiment (not shown), the MOSFET differential pair can be omitted if MOSFET operational amplifiers without input gate protection, or with input gate protection diodes at sufficiently low leakage rates, are available.

The MOSFET differential pair is used as the first stage to obtain a high input impedance. The MOSFET differential pair includes two MOSFETs 32 and 34. Photodiode 10 is coupled to the gate of MOSFET 32, and the gate of MOSFET 34 is coupled to ground. The gate of MOSFET 32 receives a voltage signal generated by current flowing through the feedback resistance resulting from the resistors, diodes, and bias networks.

Preferably MOSFETs 32 and 34 are p-channel MOSFETs fabricated on a common substrate so that they have matched properties. The substrate can be coupled to the MOSFET sources.

Resistor 62 (R0) is coupled to the MOSFET sources and substrate on one side and to the positive power supply 44a (preferably through a filter 44) on the other side for setting the bias current. Resistor 64 (R1) is coupled to the drain of MOSFET 32 and to a second input terminal (shown in FIG. 2 as a positive input terminal) of operational amplifier 24 at one end and to the negative power supply 49a (preferably through a filter 49) at the other end. Resistor 66 (R2) is coupled to the drain of MOSFET 34 and the negative input terminal of operational amplifier 24 at one end and to the negative power supply at the other end. Resistors 64 and 66 thus serve as input resistors for the differential amplifier circuit. Resistor 68 (R3) connects the positive terminal of the operational amplifier to ground. Resistor 70 (R4) is coupled between the drain of MOSFET 34 and the output terminal of operational amplifier 24 to serve as a feedback resistor for operational amplifier 24.

In one embodiment, resistor 62 has a value of 2.2 kohms (kilo-ohms), resistor 64 has a value of 10 kohms, resistor 66 has a value of 10 kohms, resistor 68 has a value of 2 mega-ohms, and resistor 70 has a value of 2 mega-ohms. Using these values, the MOSFET differential pair stage provides a gain of ten, and the operational amplifier provides a gain of 200, with a total gain of 2000 (10×200).

The low gain bias network 18 is designed to permit current flow through low gain diode 12 at about one-half full scale output signal. In one embodiment, the low gain bias network includes resistors 68 (R7) and 70 (R8) which are both coupled to low gain feedback resistor 20. A second end of resistor 68 is coupled to high gain feedback resistor 22, whereas a second end of resistor 70 is coupled to the negative power supply. The values of resistors 68 and 70 are designed to provide the appropriate voltage at node B at one-half full scale signal conditions. In one embodiment the resistance of resistor 68 is 1.1 kohms, and the resistance of resistor 70 is 15 kohms.

The clamp bias network 16 is designed to permit current flow through clamp diode 14 at full scale signal. In one embodiment, the clamp bias network includes resistors 72 (R9) and 74 (R10) which are both coupled to clamp diode 14. A second end of resistor 72 is coupled to high gain feedback resistor 22, and a second end of resistor 74 is coupled to the positive power supply. The values of resistors 72 and 74 are designed to provide the appropriate voltage at node C under full scale signal conditions. In one embodiment the resistance of resistor 72 is 4.3 kohms, and the resistance of resistor 74 is 16.2 kohms.

A filter 44 can be formed by resistor 46 (R17) and capacitor 48 (C1). One end of resistor 46 is coupled to positive voltage supply 44a which, in one embodiment supplies +8 volts at 5 milliamperes, for example. The other end of resistor 46 is coupled to a grounded capacitor 48, resistor 74 of the clamp bias network, and operating amplifier 24.

A similar filter 49 can be formed by resistor 50 (R18) and capacitor 52 (C2). One end of resistor 50 is coupled to negative voltage supply 49a which, in one embodiment supplies −8 volts at 5 milliamperes, for example. The other end of resistor 50 is coupled to a grounded capacitor 52, resistor 70 of the low gain bias network, and operating amplifier 24.

In one embodiment the resistance of each of resistor 46 and resistor 50 is 160 ohms, and the capacitance of each of capacitor 48 and capacitor 52 is 0.1 microfarads. Capacitors 48 and 50 preferably comprise capacitors capable of withstanding high temperatures. If high temperature capacitors having higher capacitance values o are available, such capacitors would be useful.

Inverting operational amplifier 28 (OA2) in one embodiment has a feedback resistor 58 (R12) with a value of 25 kohms, and a resistor 60 (R11) having a value of 10 kohms is coupled between an output terminal of operating amplifier 24 (OA1) and a negative input terminal of operating amplifier 28 (OA2) to provide a voltage gain of −2.5. A resistor 40 (R15) is included between an output terminal of operating amplifier 28 and an output terminal 40a of the photocurrent detector circuit to isolate operational amplifier 28 from cable capacitance and thereby prevent oscillation.

Non-inverting operational amplifier 26 (OA3) in one embodiment has a resistor 56 (R13) with a value of 10 kohm coupled to ground, has a feedback resistor 54 (R14) with a value of 15 kohms, and receives an output signal from operating amplifier 24 (OA1) at its positive input terminal to provide a voltage gain of +2.5. A resistor 42 (R16) is included between an output terminal of operating amplifier 26 and an output terminal 42a of the photocurrent detector circuit to isolate operational amplifier 26 from cable capacitance and thereby prevent oscillation. Resistors 40 and 42 can respectively have resistances of about 1 kohm in one embodiment.

The inverting and non-inverting operational amplifiers 28 and 26 are optional, but they are beneficial because they increase the reliability of the circuit. In the event that one of the operating amplifiers 26 or 28 becomes shorted to ground, the other can still be used.

In the present invention, filtering is difficult due to the difficulty of finding capacitors that can withstand high temperature applications and are of convenient sizes. An operational amplifier power supply rejection ratio (65 db), however, can be maintained to prevent interference from noise on the power supply lines. Preferably, any voltage change on a power supply line would cause an output signal shift equivalent to an input voltage change of only about ¹⁄₂₀₀₀ of the power supply change.

The input offset voltage when the input signal is zero appears at the first operational amplifier output terminal with a gain of about 1 because the impedance Rin from an input node D to ground is large compared with the operational amplifier 24 feedback resistance R5. $V_{out}$(min) at node A can be calculated as follows:

$$V_A(min)=V_{OS}(1-R5/Rin),$$

wherein $V_{OS}$ is the offset voltage of the differential MOSFET pair. When the signal current is zero and Rin is large compared with $R_5$, the minimum output voltage $V_A$(min) at node A will thus be $V_{OS}$.

The minimum differential output voltage between output terminals 42a and 40a will then be the minimum output voltage at node A multiplied by the combined gains in magnitude of operational amplifiers 26 and 28. The gain of the operational amplifiers 26 and 28 ($OA_{gain}$) can be multiplied by 2 when there are two amplifiers with the same magnitude of gain with opposite polarities. For the output offset voltage of the circuit of FIG. 2 to be less than or equal to fifty millivolts, the MOSFETs will have to be selected for offset voltages less than or equal to ten millivolts.

The circuit is capable of producing 0.2 volts at the differential output ($V_{out}$ positive−$V_{out}$ negative) with 20 pico-amperes of photocurrent. According to the following equation which combines offset voltage with signal current induced voltage, at node A the voltage is as follows:

$$V_A=V_{OS}(1-R5/Rin)-I_{DIODE} \times R_5, \text{ or}$$

$$V_A=V_A(min)-I_{DIODE} \times R_5$$

wherein $I_{DIODE}$ represents the current passed by the photodiode. The differential output voltage between output terminals 42a and 40a will again be $V_A$ multiplied by the combined gains in magnitude of operational amplifiers 26 and 28.

The response time of this circuit is limited by the feedback resistance-capacitance time constant. In the high gain region, the time constant is set by the high gain feedback resistance and the parallel combination of the low gain and clamp diode capacitances. This is the dominant time constant. In the low gain region, the time constant is set by low gain resistance and the clamp diode capacitance. Special low capacitance SiC diodes (of about 1 picofarad) can be used for low gain and clamp switching.

Figure 3:
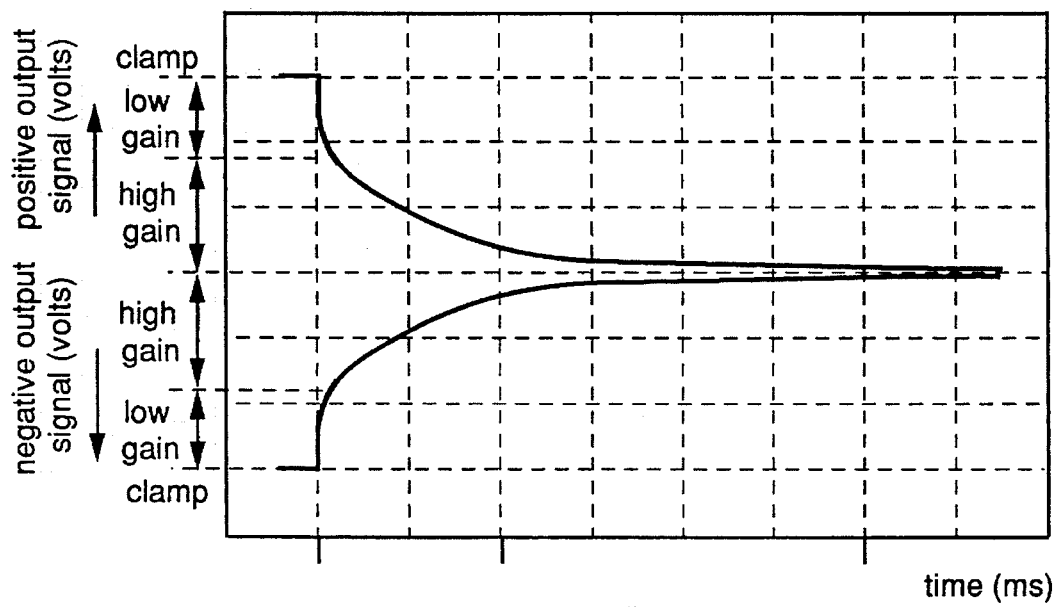
FIGS. 3 and 4 are graphs illustrating experimental data obtained using the circuit shown in FIG. 2.
Figure 4:
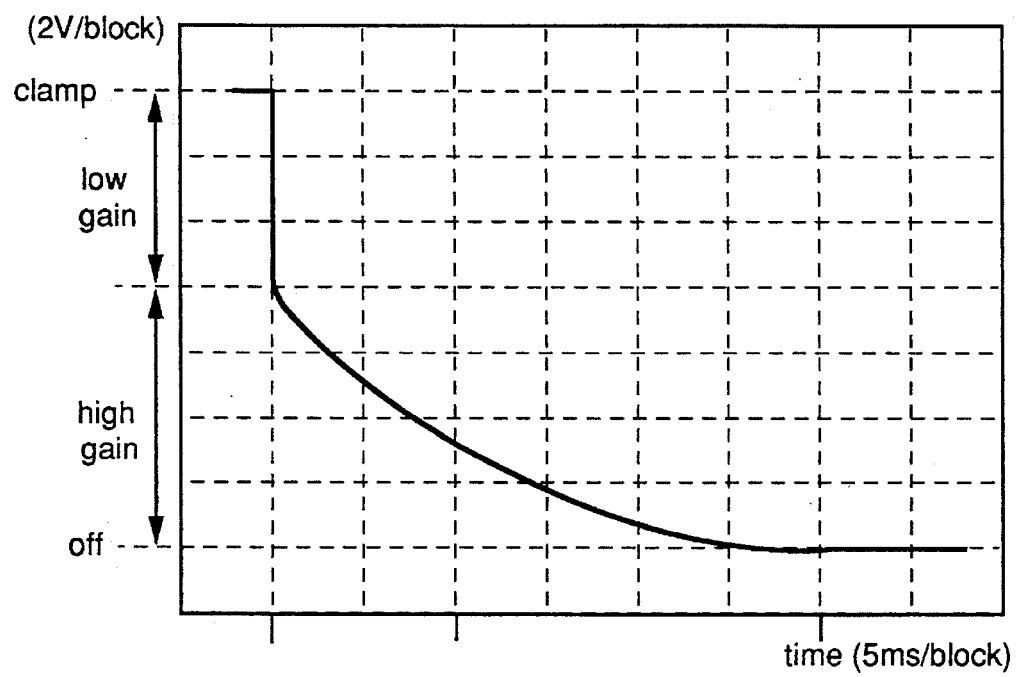

FIGS. 3 and 4 are graphs illustrating experimental data obtained using the circuit shown in FIG. 2. FIG. 3 is a o graph showing the response time through the high and low gain regions for the positive and negative output signals during device operation and after the flame or light signal is turned off, and FIG. 4 is a graph showing the difference between the two output signals over time. Because one of the signals is positive and the other is negative, the difference is equal to the sum of the two magnitudes. As expected, the difference is greatest at maximum flame intensity and decreases after a flame has been turned off to lower levels as the charge in the circuit including the diodes is discharged. FIG. 4 illustrates the levels of the flame detector from a maximum signal (clamp level) to no signal. This region is where the fast response time is needed to prevent explosions.

If interference occurring on the ground line is strong enough to interfere with the output signals, it appears as common mode interference on both outputs. If the difference of the output signal magnitudes is taken, it should cancel the interference under normal conditions.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A photocurrent detector circuit comprising:

a photodetector;

an operational amplifier, the photodetector being coupled to an input terminal of the operational amplifier;

a first resistor being coupled between the photodetector and an output terminal of the operational amplifier;

a first diode;

a second resistor, the first diode being coupled between the photodetector and the second resistor;

a low gain bias network being coupled between the second resistor and the output terminal of the operational amplifier;

a second diode being coupled to the photodetector; and a clamp bias network being coupled between the second diode and the output terminal of the operational amplifier.

2. The photocurrent detector circuit of claim 1, wherein the photodetector comprises a silicon carbide photodiode.

3. The photocurrent detector of claim 2, wherein the first and second diodes comprise silicon carbide.

4. The photocurrent detector of claim 3, wherein the low gain bias network comprises first and second low gain bias resistors coupled to the second resistor, the first low gain bias resistor further coupled to the first resistor and an output terminal of the operational amplifier, the second low gain bias resistor further coupled to a first power supply; and wherein the clamp bias network comprises first and second clamp bias resistors coupled to the clamp diode, the first clamp resistor further coupled to the first resistor, the second clamp bias resistor coupled to a second power supply.

5. The photocurrent detector of claim 3, further including first and second filters, the first filter comprising a first filter resistor coupled between a first power supply and the operational amplifier, and a first filter capacitor coupled between the first filter resistor and ground, the second filter comprising a second filter resistor coupled between a second power supply and the operational amplifier, and a second filter capacitor coupled between the the second filter resistor and ground.

6. The photocurrent detector of claim 3, wherein the operational amplifier comprises a first operational amplifier and further including:

a second operational amplifier coupled to the output terminal of the first operational amplifier and comprising a non-inverting operational amplifier; and a third operational amplifier coupled to the output terminal of the first operational amplifier and comprising an inverting operational amplifier.

7. The photocurrent detector of claim 6, further including first and second isolating resistors, the first isolating resistor being coupled between an output terminal of the second operational amplifier and a first output terminal of the photocurrent detector circuit, the second isolating resistor being coupled between an output terminal of the third operational amplifier and a second output terminal of the photocurrent detector circuit.

8. The photocurrent detector of claim 3, further including a MOSFET differential pair coupled between the photodiode and the operational amplifier, the MOSFET differential pair and the operational amplifier forming a differential amplifier.

9. The photocurrent detector of claim 8, wherein the MOSFET differential pair includes:

a first MOSFET having a gate for receiving a voltage signal generated by current flowing through a feedback resistance from the photodiode;

a second MOSFET having a gate coupled to ground, the first and second MOSFETs being fabricated on a common substrate and having sources coupled together on the common substrate;

a third resistor coupled between the MOSFET sources and a positive power supply;

a fourth resistor coupled between a drain of the first MOSFET and a negative power supply;

a fifth resistor coupled between a drain of the second MOSFET and the negative power supply;

a sixth resistor coupled between the input terminal of the operational amplifier and the output terminal of the operational amplifier; and a seventh resistor coupled between a second input terminal of the operational amplifier and ground.

10. A flame detector circuit comprising:

a photodiode comprising silicon carbide;

a first operational amplifier, the photodiode being coupled to an input terminal of the first operational amplifier;

a first resistor having a first end coupled to the photodiode and a second end coupled to an output terminal of the first operational amplifier;

a first diode comprising silicon carbide and having a first end coupled to the photodiode;

a second resistor having a first end coupled to a second end of the first diode;

a low gain bias network being coupled between a second end of the second resistor and the output terminal of the first operational amplifier;

a second diode comprising silicon carbide and having a first end coupled to the photodiode;

a clamp bias network being coupled between a second end of the second diode and the output terminal of the first operational amplifier;

a second operational amplifier coupled to the output terminal of the first operational amplifier and comprising a non-inverting operational amplifier; and a third operational amplifier coupled to the output terminal of the first operational amplifier and comprising an inverting operational amplifier.

11. The photocurrent detector of claim 10, further including a MOSFET differential pair coupled between the photodiode and the first operational amplifier, the MOSFET differential pair and the first operational amplifier forming a differential amplifier.

* * * * *